United States Patent [19]

Perdue

[11] 4,320,356
[45] Mar. 16, 1982

[54] HIGH SPEED FREQUENCY ACQUISITION APPARATUS FOR MICROWAVE SYNTHESIZERS

[75] Inventor: Edward M. Perdue, Framingham, Mass.

[73] Assignee: The United States of America as represented by the Secretary of the Air Force, Washington, D.C.

[21] Appl. No.: 123,335

[22] Filed: Feb. 21, 1980

[51] Int. Cl.³ .............................................. H03L 7/16
[52] U.S. Cl. ...................................... 331/11; 328/133; 331/17; 331/25
[58] Field of Search ...................... 331/1 A, 10, 11, 12, 331/16, 17, 18, 25, 27; 328/133, 134, 155

[56] References Cited
U.S. PATENT DOCUMENTS 4,048,581  9/1977  Lyberg .............................. 331/1 A
4,272,729  6/1981  Riley, Jr. ........................... 331/1 A Primary Examiner—Siegfried H. Grimm
Attorney, Agent, or Firm—Donald J. Singer; William Stepanishen

[57] ABSTRACT

A high speed frequency acquisition apparatus utilizes a variable rate clocking circuit to establish the response time of the frequency comparator which compares the desired frequency with a reference frequency. The clocking circuit rate is determined by the inverse of the frequency difference between the two frequency signals.

5 Claims, 3 Drawing Figures

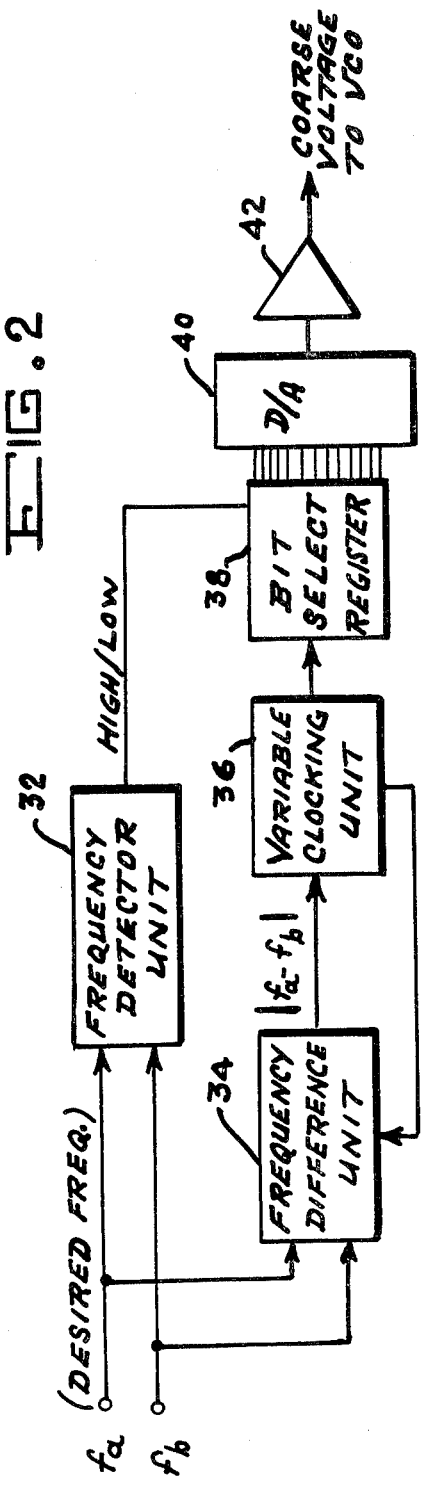
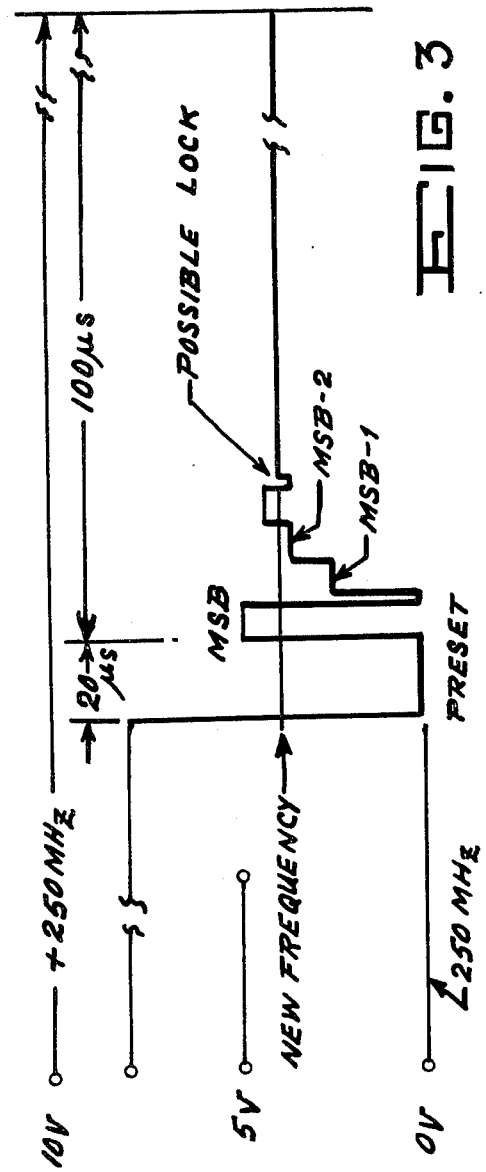

HIGH SPEED FREQUENCY ACQUISITION APPARATUS FOR MICROWAVE SYNTHESIZERS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to frequency synthesizers, and in particular to a high speed phase locked loop microwave synthesizer.

In the present art, microwave synthesizers exist in two forms either direct or indirect. Direct synthesizers have the advantage of frequency acquisition in less than 10 microsecond tuning time but have the disadvantage of high spurious output levels. Indirect synthesizers produce no spurious signals in the output frequency, but are slow in acquisition time.

The previously utilized phase locked sources were tuned mechanically to some frequency and electronically sweep at a low rate over a very narrow band in order to lock the loop. Methods utilizing linearizers and preset voltages have been used to lock the loop. A disadvantage with this approach has been with the noise of the linearizer and the temperature dependence of the circuits. In addition, sweep circuits consisting of up-/down counters have been employed with acquisition times ranging from milliseconds up to seconds. Consequently, present fast frequency hopping synthesizers employ direct synthesis techniques which comprise a combination of switching and arithmetic manipulations such as mixing, multiplication and division to provide the desired rapid frequency hopping. The resulting frequency signals generated by these latter named frequency hopping synthesizers have relatively poor spectral purity due to the difficulty of eliminating undesired spurious mixer products, and other problems which are associated with these synthesizers such as switch leakage. In addition, fast frequency hopping synthesizers using such a direct synthesis implementation tend to be large and expensive due to complex filtering, shielding and radio frequency interference elimination requirements. Fast frequency hopping synthesizers using phase locked loop techniques solve many of the aforementioned problems associated with synthesizers operating in accordance with direct synthesis techniques. However, standard phase locked loop synthesizers are generally handicapped in their use in fast frequency hopping synthesizers, as previously mentioned, because of the limited speed at which they permit transitions between frequencies to be made.

SUMMARY OF THE INVENTION

The present invention utilizes a direct frequency synthesizer for frequency tuning and an indirect frequency synthesizer to remove spurious output signals from the desired output frequency, thereby permitting high speed tuning of the indirect synthesizer. The indirect synthesizer is a phase locked loop unit which includes a coarse acquisition unit to compare the desired frequency with a reference frequency and to provide an output signal corresponding to the state of the difference between the two frequencies. The comparator output signal is clocked through a bit selection register to a digital to analog converter where it is converted to an analog voltage that is applied to a voltage controlled oscillator.

It is one object of the present invention, therefore, to provide an improved microwave frequency synthesizer.

It is another object of the invention to provide an improved microwave frequency synthesizer wherein a direct synthesizer is used for tuning and an indirect synthesizer removes spurious noise levels.

It is another object of the invention to provide an improved microwave frequency synthesizer that utilizes high speed tuning of an indirect synthesizer.

It is yet another object of the invention to provide an improved microwave frequency synthesizer that can lock on to a new frequency in the tuneable band of the voltage controlled oscillator in less than 100 microseconds.

These and other advantages, objects and features of the invention will become more apparent from the following description taken in connection with the illustrative embodiment in the accompanying drawings.

BRIEF DESCRIPTION OF THE DRAWINGS

FIG. 2 is a block diagram of the high speed frequency acquisition apparatus; and, FIG. 3 is a graphical representation of the coarse acquisition voltage waveform from the high speed frequency acquisition apparatus.

DESCRIPTION OF THE PREFERRED EMBODIMENT

Figure 1:
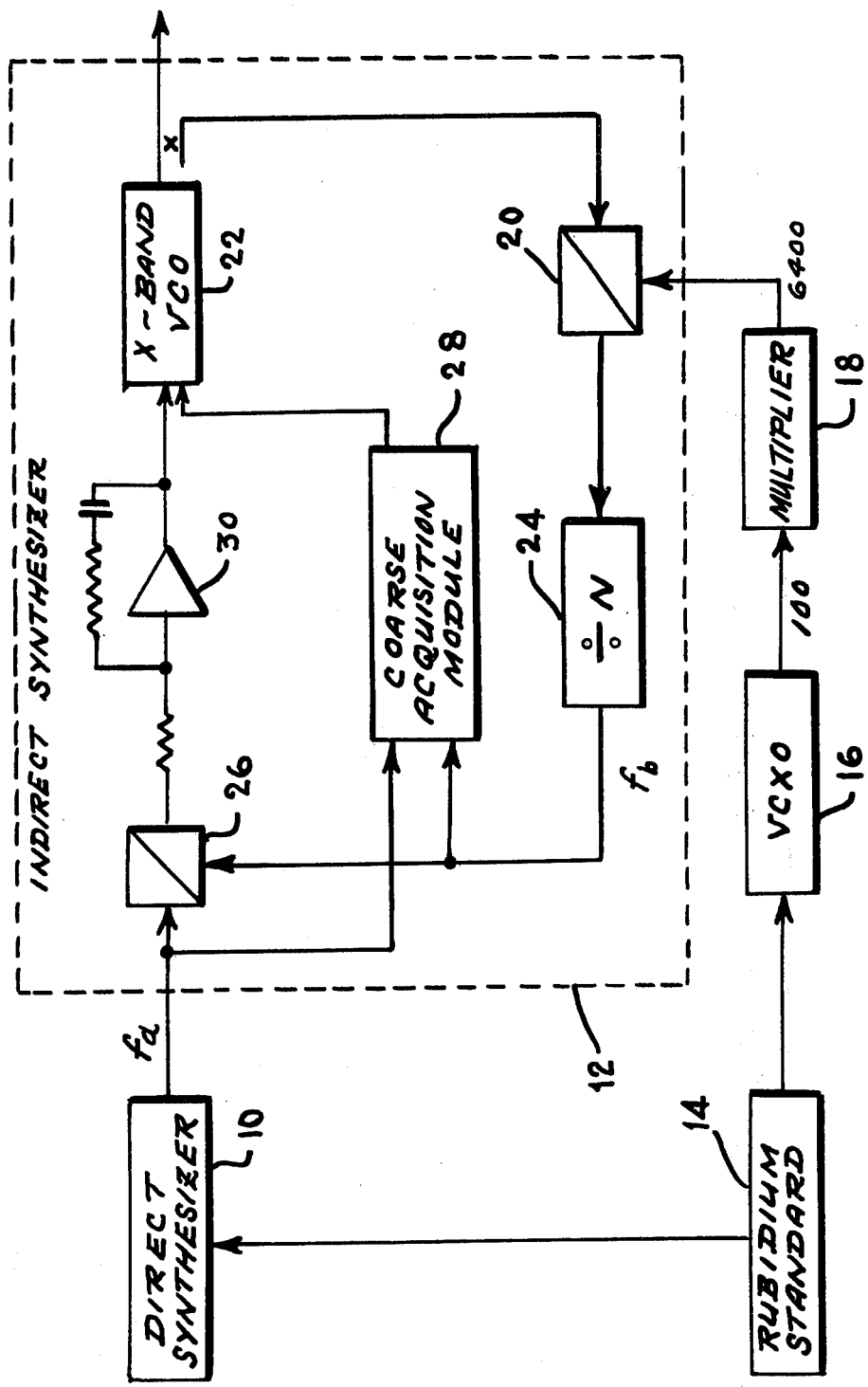
FIG. 1 is a block diagram of a fast hopping microwave synthesizer utilizing the high speed frequency acquisition apparatus.

Referring now to FIG. 1, there is shown a fast hopping microwave synthesizer utilizing a direct synthesizer 10 and an indirect synthesizer 12 to produce microwave frequencies. A rubidium standard 14 provides a coarse reference frequency to both the direct synthesizer 10 and the indirect synthesizer 12.

The reference frequency is applied to a voltage-controlled oscillator 16 which generates a 100 megacycle output frequency. The multiplier unit 18 receives the output frequency and multiplies it by a predetermined number (in the present example by 6400) to provide a reference frequency output. The RF mixer unit 20 receives the reference frequency output and the frequency output from the X-band oscillator 22 and provides an input to divider unit 24. The output signal, $f_b$, from the divider unit 24 is applied to the RF mixer unit 26 and the coarse acquisition unit 28. The direct synthesizer 10 provides its output signal, $f_a$, to the RF mixer unit 26 which applies an error output signal to amplifier 30. The error output signal is amplified by amplifier 30 and applied to the X-band voltage-controlled oscillator 22. The coarse acquisition unit 28 which also receives the output signal, $f_a$, compares the difference between the signals $f_a$, $f_b$ to determine whether $f_a$ is greater than or less than $f_b$. An output which corresponds to the relationship between the two signals $f_a$, $f_b$ is delayed in the coarse acquisition unit 28 for a period of time that is defined by:

$$t \leq \frac{1}{|f_a - f_b|}$$

After the time period t has occurred, the coarse acquisition unit 28 generates a coarse voltage output that is applied to the oscillator unit 22. The X-band oscillator unit 22 generates a microwave frequency corresponding to the sum of the received input voltages.

Turning now to FIG. 2, there is shown a block diagram of the coarse acquisition unit receiving the signals, $f_a$, $f_b$ which are utilized to generate the frequency correction signal. The frequency detector unit 32 receives the signals $f_a$, $f_b$ and determines the frequency difference therebetween according to the relationship $f_a \lessgtr f_b$. The signals $f_a$, $f_b$ are also applied to a frequency differencing unit 34 wherein the difference between the signals is expressed as $|f_a-f_b|$. The output of the differencing unit 34 is applied to the variable clocking unit 36 wherein the time period, t, is established according to the expression:

$$t \leq \frac{1}{|f_a - f_b|}.$$

The output from the frequency detector unit 32 may be either high or low according to whether $f_a$ is greater or less than $f_b$. The output from frequency detector unit 32 is high when $f_a$ is greater than $f_b$ and is low when $f_a$ is less than $f_b$. When the time period, t has elapsed the clocking unit 36 provides an output to the bit select register unit 38 which applies the output signal from the frequency detector unit 32 to the digital to analog converter unit 40. The output from the digital to analog converter unit 40 is applied to the amplifier unit 42 which provides a coarse output voltage.

In FIG. 3, there is illustrated a typical coarse acquisition voltage waveform. When a new frequency is applied to the indirect synthesizer, the coarse voltage homes into the desired frequency in steps. The fine loop is actively connected and will pull in when the requirement, $$\left(\frac{d \Delta \omega}{dt}\right) < \frac{\omega n^2}{2},$$

is reached. When the fine loop locks, the coarse loop is disabled, maintaining the coarse voltage that was present at lock. With this type of acquisition, and depending on how close a decision is to the loop acquisition bandwidth and slew rate, acquisition may occur any time between 20 microseconds out to 100 microseconds.

Although the invention has been described with reference to a particular embodiment, it will be understood to those skilled in the art that the invention is capable of a variety of alternative embodiments within the spirit and scope of the appended claims.

What is claimed is:
1. In a microwave synthesizer, a high speed frequency acquisition apparatus comprising in combination:
   frequency detector means receiving a first and second frequency and providing either a high or low output, said high output corresponds to said first frequency being greater than said second frequency, said low output corresponds to said first frequency being less than said second frequency,
   means for frequency differencing receiving said first and second frequency, said frequency differencing means providing an output, said output equals the absolute magnitude of said first frequency minus said second frequency,
   clock means for generating a variable rate clocking frequency, said clock means receiving said output from said frequency differencing means, said clock means generating a clock frequency in response to said frequency differencing means output, said clock frequency defining a time period,
   a bit select register for providing a plurality of digital bits, said bit select register receiving said high/low output from said frequency detector means, said bit select register receiving said clock frequency from said clock means, said bit select register generating a digital word in response to said clock frequency and said high/low output, and
   a D/A converter means receiving said digital word from said bit select register, said D/A converter means converting said digital word to an analog voltage, said D/A converter means providing said analog voltage as an output, said analog voltage tuning said microwave synthesizer to the desired frequency.
2. A high speed acquisition apparatus as described in claim 1 further including an amplifier means to receive said analog voltage from said D/A converter means, said amplifier means amplifying said analog voltage to provide a coarse voltage output.
3. A high speed acquisition apparatus as described in claim 1 wherein said time period equals the inverse of the absolute magnitude of the frequency difference between said first frequency and said second frequency.
4. A high speed acquisition apparatus as described in claim 1 wherein said first frequency is the desired frequency and said second frequency is the reference frequency.
5. A high speed acquisition apparatus as described in claim 1 wherein said bit select register generates said digital word after said time period has passed.

* * * * *